United States Patent [19]
Todokoro et al.

[11] Patent Number: 5,598,002
[45] Date of Patent: Jan. 28, 1997

[54] ELECTRON BEAM APPARATUS

[75] Inventors: Hideo Todokoro, Tokyo; Tadashi Otaka, Katsuta; Tatsuya Maeda, Katsuta; Katsuhiro Sasada, Katsuta, all of Japan

[73] Assignee: Hitachi, Ltd., Tokyo, Japan

[21] Appl. No.: 632,664

[22] Filed: Mar. 28, 1996

Related U.S. Application Data

[63] Continuation of Ser. No. 296,150, Aug. 25, 1994, abandoned.

Foreign Application Priority Data

Aug. 26, 1993 [JP] Japan .................................. 5-211814

[51] Int. Cl.⁶ .................................................. G02B 21/18
[52] U.S. Cl. ................................................ 250/310; 359/387
[58] Field of Search .................................... 250/310, 306, 250/396 R; 359/363, 387

[56] References Cited

U.S. PATENT DOCUMENTS

| | | | |
|---|---|---|---|
| 3,800,152 | 3/1974 | Daigne et al. | 250/310 |
| 4,410,272 | 10/1983 | Beauvineau et al. | 250/310 |
| 4,437,009 | 3/1984 | Yamazaki | 250/310 |
| 4,440,475 | 4/1984 | Colliaux | 250/310 |
| 4,537,477 | 8/1985 | Takagi et al. | 250/310 |
| 4,990,776 | 2/1991 | Fushimi et al. | 250/310 |

FOREIGN PATENT DOCUMENTS

| | | |
|---|---|---|
| 61-104551 | 5/1986 | Japan . |
| 63-254649 | 10/1988 | Japan . |
| 1-120749 | 5/1989 | Japan . |

*Primary Examiner*—Jack I. Berman
*Assistant Examiner*—Kiet T. Nguyen
*Attorney, Agent, or Firm*—Antonelli, Terry, Stout & Kraus, LLP

[57] ABSTRACT

An electron beam apparatus focusses an electron beam onto a specimen by means of an objective magnetic lens. In order to detect changes in the height of the specimen, a laser light beam from a laser source is incident on the specimen and the reflected laser beam is detected by a light detector. Any change in the height of the specimen changes the path of the laser beam to the detector. Therefore, by monitoring the detector, the focussing of the electron beam on the specimen can be controlled by varying the current to an excitation coil of the objective magnetic lens or by moving the specimen via a mounting stage. At least one of the pole pieces of the objective lens is on the opposite side of the path of the laser beam to the source of the electron beam, so that the objective magnetic lens may be close to the specimen, permitting a short focal length. Thus, the laser beam may pass between the pole pieces. An optical microscope may also be provided to permit the specimen to be viewed. The viewing path of the optical microscope extends through an opening in one or both of the pole pieces of the objective magnetic lens.

11 Claims, 4 Drawing Sheets

ELECTRON BEAM APPARATUS

This is a continuation of application Ser. No. 08/296,150, filed Aug. 25, 1994, now abandoned.

BACKGROUND OF THE INVENTION

1. Field of the Invention

The present invention relates to an electron beam apparatus, such as an electron microscope.

2. Summary of the Prior Art

When an electron microscope is used to investigate a specimen, such as a semiconductor wafer, an electron beam from an electron source is focussed onto the specimen by an objective magnetic lens. When an area of the sample is to be investigated, the electron beam is caused to scan the specimen, either by causing the point of incidence of the electron beam on the specimen to change by control of scanning means controlling the path of the electron beam, or by moving the specimen by moving a mounting stage on which the specimen is mounted. Such scanning occurs in electron beam lithography, and also in critical-dimension measurements, carried out on semiconductor wafers.

However, in such electron beam apparatus, the surface of the sample may not be wholly even, and this is a particular problem with large silicon wafers having diameters of the order of 20 cm. Thus, the height of the surface of the wafer relatively to the objective magnetic lens may change, and this may result in the electron beam becoming out of focus.

For this reason, it has been proposed that means are provided for detecting the change in the wafer height. The focus of the electron beam may then be varied, by controlling the objective lens and/or by moving the mounting stage to move the wafer.

JP-A-63-254649 disclosed such a height measuring means, in which light from a laser was directed onto the specimen at a position corresponding substantially to the point of incidence of the electron beam, and reflection of that light from the specimen was detected by a light detector. If the height of the specimen changed, there would be a change in the point of incidence of light beam on the specimen, and this could be detected by movement of the reflected light beam at the detector. Hence, by controlling the focussing of the electron beam and/or position of the wafer using the information form such a light detector, it was possible to maintain the electron beam in focus.

SUMMARY OF THE PRESENT INVENTION

Developments in semiconductor technology have permitted finer structures to be formed on semiconductor wafers. However, this then requires the focal length of the objective magnetic lens of an electron beam system to be reduced, bringing the objective lens closer to the specimen. In JP-A-63-254649, the laser beam passes between the objective lens and the specimen, but this becomes more difficult as the objective lens approaches the specimen. There is thus an apparent contradiction between the desire for a short focal length in order to generate or investigate fine details, and the need for height measurement.

In according with a first aspect of the present invention, it is proposed that at least one, possibly both, of the pole pieces of the objective lens are on the opposite side of the optical path of the light beam from the source of the electron beam. Thus, the geometrical relationship between the light beam and the pole pieces of the objective magnetic lens are changed relative to known arrangements, to permit at least one of those pole pieces to approach closely the specimen without interfering with the path of the laser beam used in height measurement.

In one arrangement, which may be considered a second aspect of the present invention, the laser beam passes between the upper and lower pole pieces of the objective magnetic lens. Hence, the lower pole piece may be very close the specimen, permitting a very short focal length for the electron beam, but permitting the light beam to reach the specimen through e.g. the hole in the lower pole piece through which the electron beam passes, to permit height measurement to be carried out. Preferably, in such an arrangement, the lower pole piece is a substantially flat plate, so that it can be very close to the specimen.

Other arrangements of the pole pieces of the objective magnetic lens are possible, however. For example, it is possible to have one, or even both, of the pole pieces on the opposite side of the sample to the source, and yet still focus the electron beam on the sample. If one or both of the pole pieces are on the opposite side of the specimen to the source, the light beam can be incident on the specimen without difficulty.

Since the path of the electron beam must be under vacuum, the pole pieces of the objective magnetic lens are preferably joined by an isolation wall, with there being windows in that isolation wall through which the light beam then passes. Those windows may incorporate lenses to focus the light beam.

It is also desirable to permit optical inspection of the specimen via an optical microscope. As the objective magnetic lens approaches the specimen, in order to achieve a short focal length, the inspection of the specimen via an optical microscope becomes more difficult. Therefore, a third aspect of the present invention proposes that such an optical microscope be provided which has a viewing path through at least one of the pole pieces of the objective lens. This third aspect is an independent aspect of the present invention, but may be used in conjunction with the other aspects.

Where the viewing path extends through a pole piece, there will then have to be a corresponding aperture in that pole piece, and this could create asymmetry in the magnetic field produced by the objective magnetic lens. Therefore, a plurality of such apertures are provided, arranged symmetrically, with the viewing path of the optical microscope extending through one of the apertures.

BRIEF DESCRIPTION OF THE DRAWINGS

Embodiments of the present invention will now be described in detail, by way of example, with reference to the accompanying drawings, in which.

DETAILED DESCRIPTION

Figure 1:
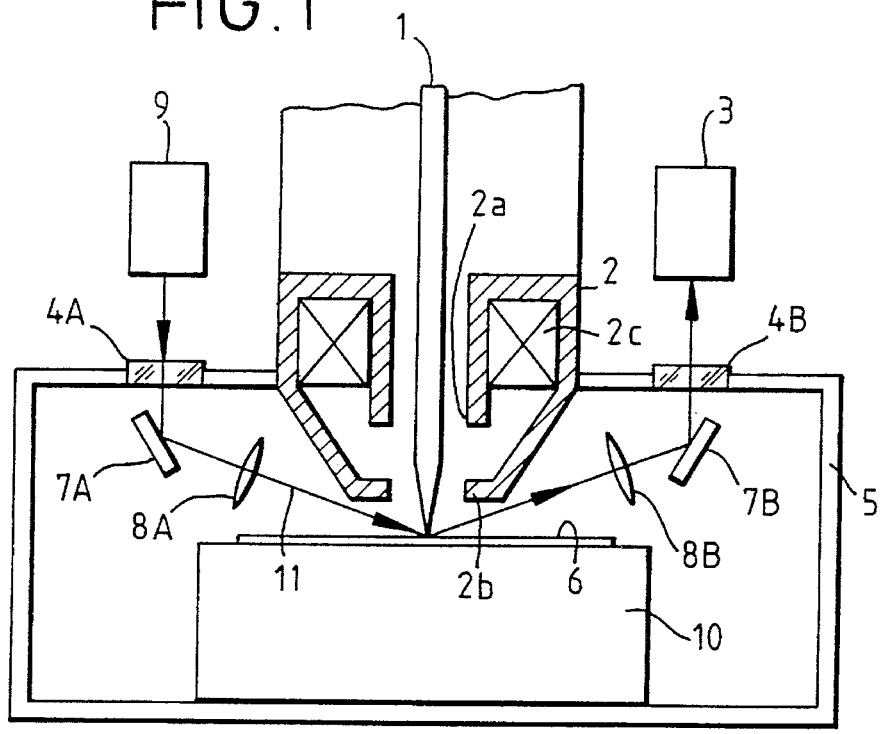
FIG. 1 shows an electron beam apparatus incorporating a conventional height measurement arrangement.

Before describing embodiments of the present invention, the general principals of height measurements will be discussed. FIG. 1 shows an electron beam critical-dimension measuring apparatus being an example of electron beam apparatus with means for measuring the height of a specimen. The apparatus shown in FIG. 1 is not an embodiment of the present invention, but corresponds generally to the apparatus disclosed in JP-A-63-254649 referred to previously. Thus, an electron beam 1 is converged onto a specimen, the specimen being a semiconductor wafer 6 in this embodiment. The wafer 6 is mounted on a moveable mounting stage 10, and there is an objective lens 2 above the mounting stage 10. In FIG. 1, a source and a scanning unit for the electron beam 1 and a critical-dimension measuring unit are not shown but will normally be present. In the apparatus of FIG. 1, the objective lens 2 comprises two interconnected pole pieces (magnetic poles) 2a,2b and a drive coil 2c. Current in the drive coil 2c generates a magnetic field between the (magnetic poles) 2a,2b which focusses the electron beam 1 on the wafer 6.

In order to measure the height of the wafer 6, the apparatus has a laser light-emitting element 9 to generate a laser beam 11, a window 4A to guide the laser beam 11 to a vacuum specimen chamber 5, a mirror 7A, a light condenser lens 8A, a reflected light condenser lens 8B, a mirror 7B, a window 4B, and a position sensor 3. The laser beam 11 is incident on the wafer 6 at an angle to the normal to the surface of the wafer 6, and hence the position of the laser beam reflected from the wafer 6 to the position sensor 3 changes depending on the height of the wafer 6 relative to the laser light-emitting element 9 and the position sensor 3. Therefore, the height of the wafer 6 can be measured by means of measuring the changes in the position of the reflected laser beam using the position sensor 3. Information about the height of the wafer is then fed back to a height adjusting mechanism for the stage 10 or to a focus adjusting mechanism for the objective lens 2. In this way, although measuring preparations such as adjustment of the focus of the electron beam 1 may be performed by an operator at the beginning of measurement, after that the focusing of the electron beam 1 may be automatically controlled to compensate for changes in the height of the wafer 6 and critical-dimension measurement over the whole of the wafer 6 can be carried out automatically.

The trend of increasing integration of semiconductor integrated circuits has required the electron beam 1 to have as small a cross-section as possible when focussed on the wafer 6. In order to make the electron beam thin, it is necessary to reduce the focal length of the objective lens 2. However, such reduction in the focal length causes the bottom surface of the objective lens 2 to approach close to the wafer 6. However, when the objective lens 2 is close to the wafer 6, there is insufficient space therebetween for the laser beam to pass, and height measurement cannot be carried out with the apparatus of FIG. 1.

EMBODIMENT 1

Figure 2:
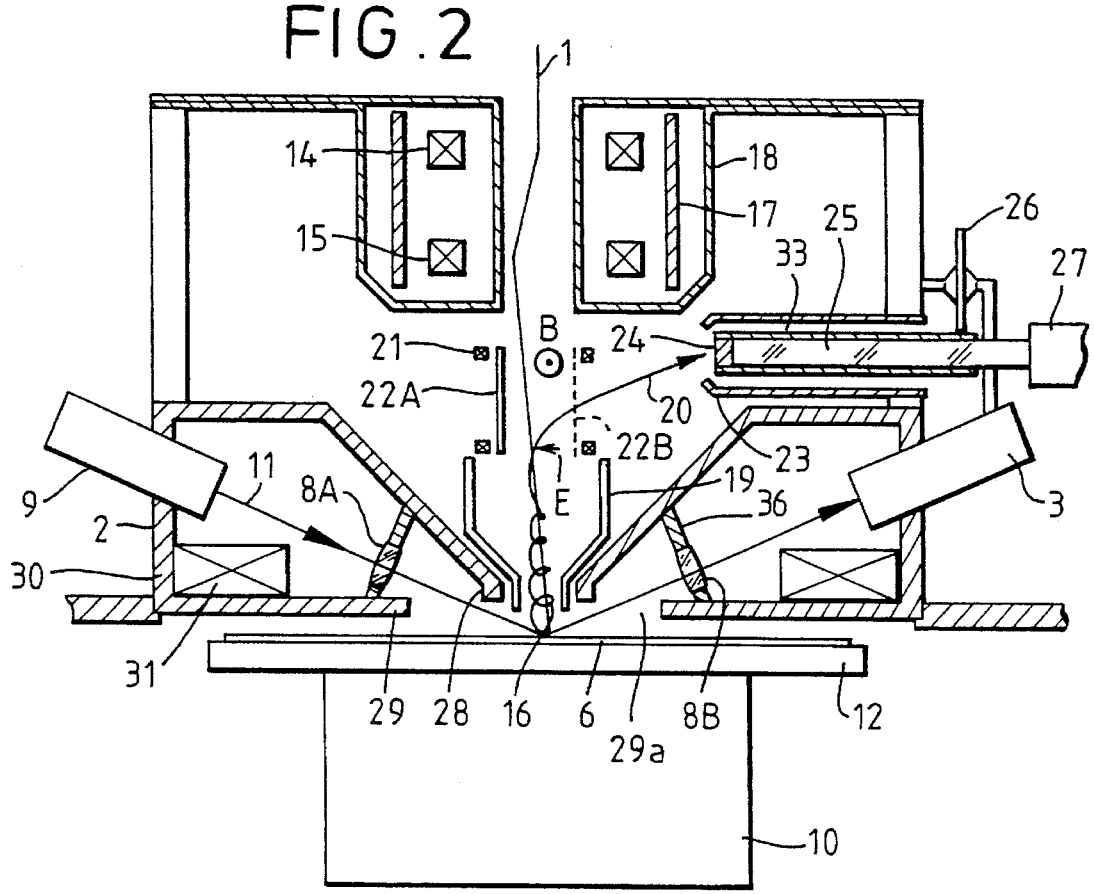
FIG. 2 shows part of an electron beam apparatus according to a first embodiment of the present invention.

FIG. 2 is a cross-sectional view of part of a first embodiment according to the present invention.

In the first embodiment, a wafer 6 is fixed on a wafer holder 12 and is moveable in horizontal and vertical directions by a stage 10. An electron beam 1 is incident on the wafer 6, the scanning of the electron beam 1 on the wafer being controlled by an upper scanning coil 14 and a lower scanning coil 15. The use of a two stage scanning coil, formed by the upper scanning coil 14 and the lower scanning coil 15, permits the position of the electron beam 1 to be adjusted so that it always passes through the center 16 of an objective lens 2. This prevents the beam 1 going out-of-focus due to displacement of the electron beam 1 from the lens center 16. The electron beam 1 is focussed so that it passes the lens center 16 of the objective lens 2 and is converged onto the wafer 6. This focussing is achieved by the objective lens 2, which comprises an upper magnetic pole 28, a lower magnetic pole 29, a magnetic path connector 30 and an excitation coil 31. The objective lens 2 in this embodiment is shaped so that the lower magnetic pole 29 adjacent the wafer 6 is in the form of a flat plate so as that it can be positioned as close as possible to the wafer 6.

There is a ferrite core 17 extending around the upper scanning coil 14 and the lower scanning coil 15 to prevent leakage of the magnetic field generated by the scanning coils 14,15. The upper scanning coil 14, the lower scanning coil 15 and the ferrite core 17 are contained in a coil case 18 to isolate them from the vacuum space through which the electron beam 1 passes and are maintained at atmospheric pressure.

Secondary electrons 20 generated by irradiation of the wafer 6 by the electron beam 1 are accelerated by an accelerating electrode 19 and are deflected by an electric field E produced by an electrostatic deflector comprising deflecting plates 22A and 22B. The deflecting plate 22B is in the form of a mesh so that the deflected secondary electrons 20 may penetrate the deflecting plate 22B. Although the electron beam 1 is deflected by the electrostatic deflector, mis-alignment of the electron beam 1 is prevented by placing the deflecting coil 21 at the same position as the deflecting plates 22A and 22B. Therefore, the direction of the magnetic field B produced by the deflecting coil 21 is opposite to that of the deflection of the electron beam 1 by the electrostatic deflector. Moreover, the magnitude of the magnetic field is chosen so as to compensate for the deflection.

The secondary electrons 20 which haves passed through the mesh 22B are attracted to a scintillator 24 to which a high voltage (for example, 10 kV) is applied. The secondary electrons 20 therefore collide with the scintillator 24 to cause the emission of light. The light emitted passes to a photo-multiplier 27, through a light guide 25, where it is detected and amplified. The light guide 25 is enclosed by a metallic cylinder 25, to which a high voltage is applied from an input terminal 26 to supply high voltage to the scintillator 24. The secondary electrons 20 amplified by the photo-multiplier 27 are further amplified and converted into a brightness modulating signal for a cathode ray tube (not shown) to form a scanning image on the cathode ray tube.

A laser (light-emitting) element 9 is fixed to a magnetic path 30 of the objective lens 2. A laser beam 11 emitted from the laser element 9 is incident on the wafer 6, passing between the upper magnetic pole 28 and the lower magnetic pole 29. The laser beam 11 is converged on the wafer 6 by the light condenser lens 8A. The laser beam 11 is then reflected by the wafer 6 and is converged onto the position sensor 3 by the light condenser lens 8B. This permits any change in the angle of incidence of the laser beam 11 on the wafer 6 to be detected by the position sensor 3. Any such change corresponds to a change in height of the wafer 6, and thus a change in the height of the wafer 6 can be detected. The information about the height of the wafer 6 is fed back as data for focusing correction for the objective lens 2 or for height correction for the stage 10. The light condenser lenses 8A, 8B are fixed to a ring-shaped isolating wall member 36 made of non-magnetic material through vacuum seals. The volume inside the ring-shaped isolating wall member 36, which communicates with the electron beam passage, is maintained under vacuum. The laser element 9 and the position sensor 3 are attached to the magnetic path connector 30 using screws such that an operator may adjust the direction of optical axis or the visual field.

Although the laser element 9 and the detector 3 may be contained inside the objective lens 2, it is advantageous for them to be attached to the magnetic path connector 30 of the objective lens 2, as shown in FIG. 2, in order to permit optical adjustment to be performed easily and in order to prevent unnecessary increase in size of the objective lens 2. Since the lower magnetic pole 29 of the objective lens 2 in the embodiment is flat, the space surrounding the upper magnetic pole 28, the lower magnetic pole 29 and the magnetic path connector 30 is large enough for the laser element 9, the position sensor 3, and the condenser lenses 8A and 8B to be positioned easily.

Thus, in this embodiment, the laser beam 11 does not pass below the lower magnetic pole 29 of the electron lens, as it does in the apparatus of FIG. 1. Instead, the laser beam 11 passes between the upper and lower magnetic poles 28,29, so that the lower magnetic pole 29 is on the opposite side of the laser beam 11 from the source of the electron beam 1, and the magnetic poles 28,29 are themselves on opposite sides of the optical path of the laser beam 11. The laser beam 11 reaches the wafer 6 through a gap 29a in the lower magnetic pole 29, and that gap 29a must therefore be sufficiently wide that the edges of the lower pole 29 do not interfere with the laser beam 11. However, since the lower pole 29 is flat, it may be positioned very close to the wafer 6 and therefore the enlarged size of the hole 29a, as compared with existing arrangements, does not affect the performance of the objective lens 2.

By arranging the laser element 9 and the position sensor 3 as shown in FIG. 2, so that the laser beam 11 passes between the magnetic poles (pole pieces) 28,29 of the objective lens 2, the objective lens 2 can be brought very close to the wafer 6, permitting the objective lens 2 to have a short focal length, without the measurement of the height of the wafer 6 being affected.

EMBODIMENT 2

Figure 3:
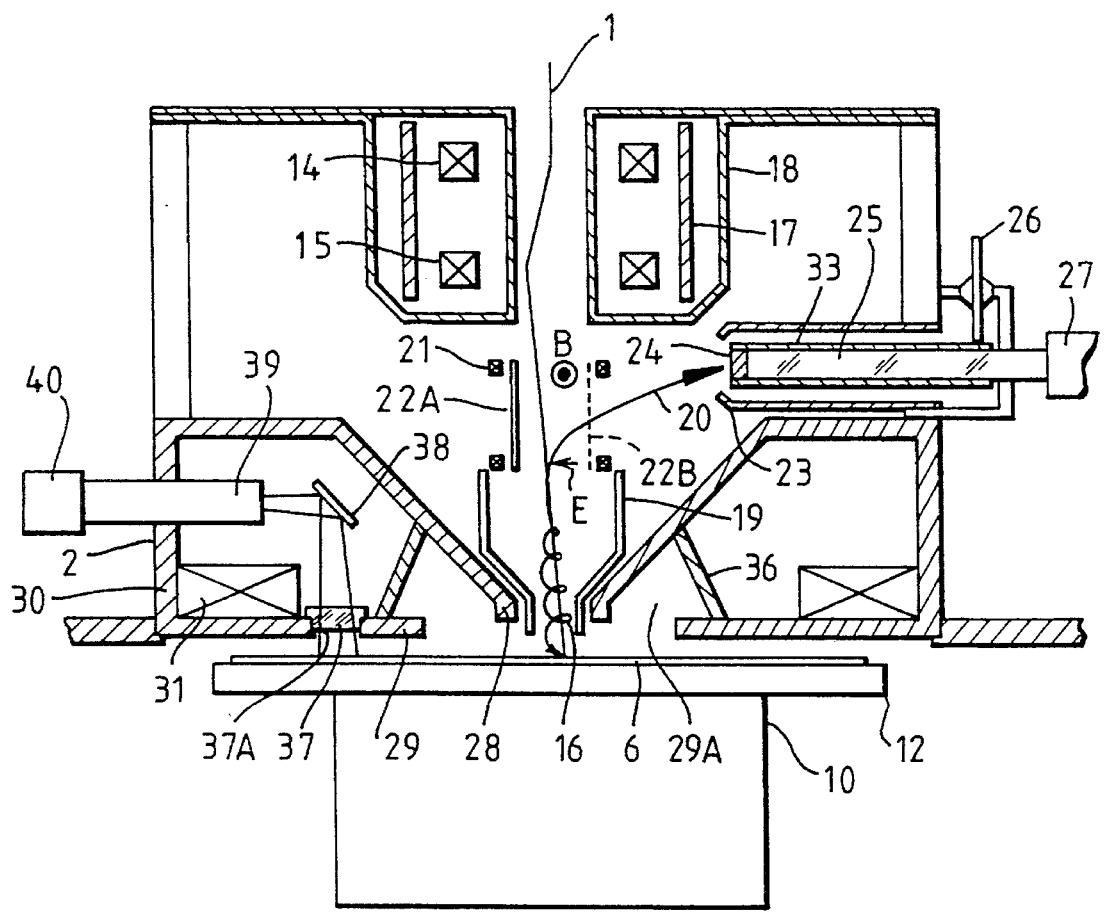
FIG. 3 shows part of an electron apparatus according to a second embodiment of the present invention.

FIG. 3 is a cross-sectional view of a second embodiment of an electron beam apparatus, which has an optical microscope in addition to the means for measuring height shown in FIG. 2. The cross-section of FIG. 3 is perpendicular to that of FIG. 2, and therefore the laser element 9 and the position sensor 3 are not shown in FIG. 3.

A window 37 is provided in the surface of the lower magnetic pole 29 of the objective lens adjacent the wafer 6. The optical microscope 39 permits a part of the wafer 6 to be viewed via an image mirror 38. The image, magnified by the optical microscope 39, is converted into electric signals by a solid-state camera element 40 to permit the image to be displayed on a cathode ray tube (not shown). The magnification of the optical image is low, so that a scanning image using the electron beam 1 is not easy to obtain, and the optical image is used for confirming the observing position on the wafer 6. The difference between the observing position of the electron beam 1 and the observing position of the optical microscope 39 is measured in advance and corrected using the stage 10. Adjustment of the focus is carried out by adjusting the height of the stage 10.

In this arrangement, the optical image formed by the optical microscope 39 may be used to adjust the focus of the electron beam 1. To do this, a coarse adjustment is carried out first by moving the stage 10 upward and downward so that the contrast in the optical microscope image is maximum. Then, adjustment of the focus of the electron beam 1 is carried out using the laser beam. The method of adjusting the focussing using an inclined incipient laser beam 11 and a position sensor 3 (as in the embodiment of FIG. 2) has the advantage that the change in height of the wafer 6, and hence the incipient position of the electron beam 1, can be measured with a high accuracy. However, this method has a narrow dynamic range. By combining this with the method using the contrast of optical image by using an optical microscope having a relatively wide dynamic range, the operation of initial focus adjustment at the beginning of measurement becomes easy.

Figure 4:
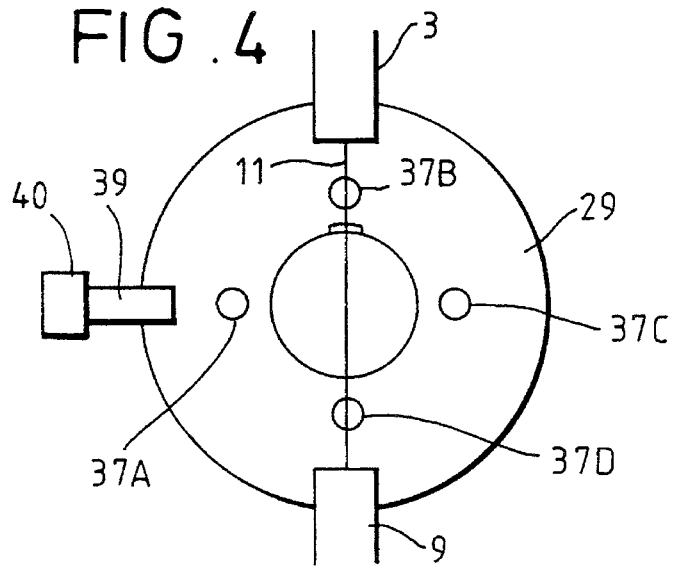
FIG. 4 shows a plan view of the lower pole piece in the embodiment of FIG. 3.

Although only one opening 37A containing window 37 is shown in FIG. 3, FIG. 4 shows that a plurality of windows 37A,37B,37C 37D, are provided in an axially symmetric relationship relative to the path of the electron beam 1 through the objective lens 2 to prevent the magnetic characteristic of the objective lens 2 from becoming asymmetric. FIG. 4 also shows how the embodiment of FIG. 3 has the optical microscope 39 at right-angles to the path of the laser beam 11 from the laser element 9 to the position sensor 3.

Figure 5:
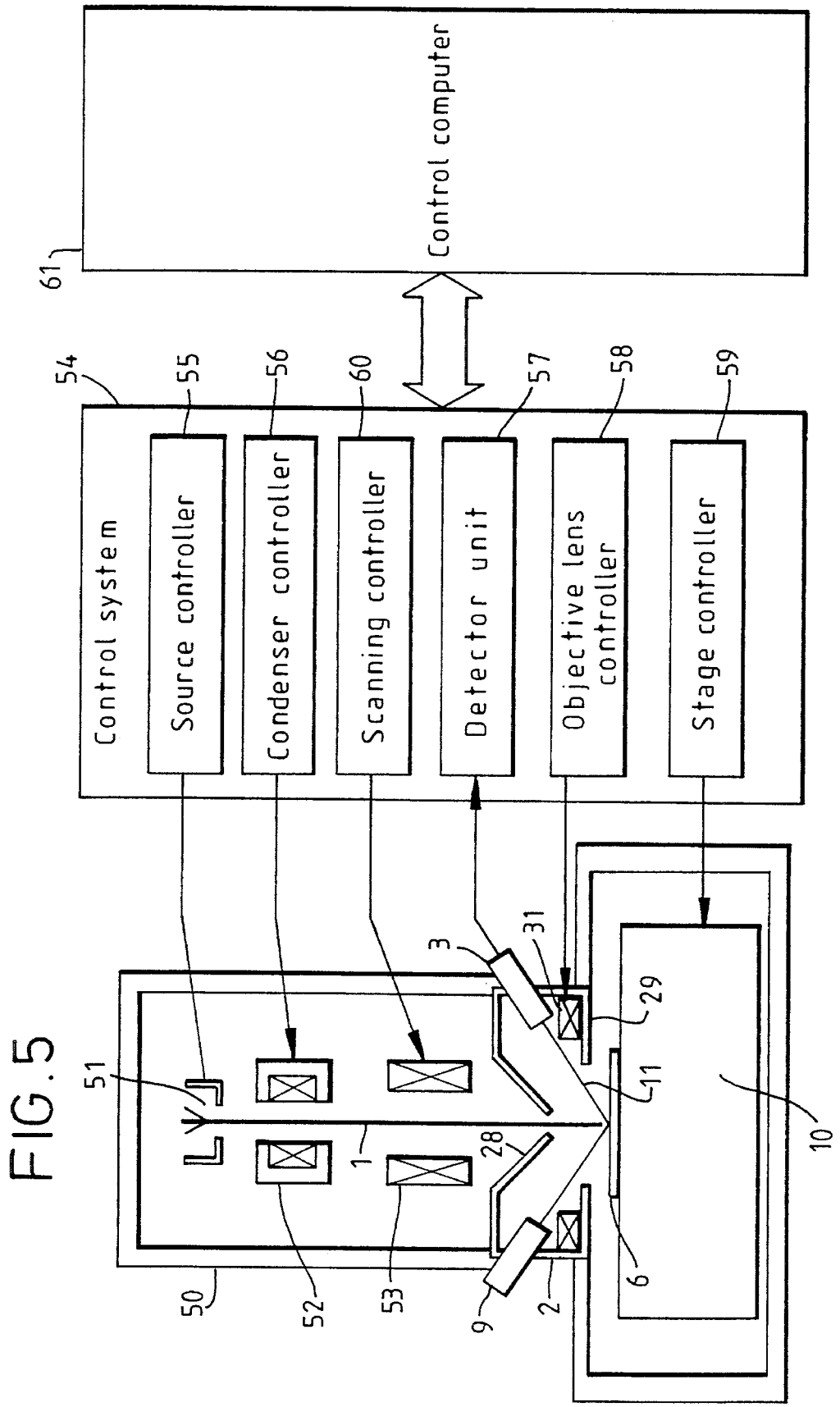
FIG. 5 shows a critical-dimension mention measuring apparatus which incorporates the embodiment of FIG. 2 or FIG. 3.

The apparatus of FIGS. 2 or 3 may be incorporated in a critical-dimension measurement system, as shown in FIG. 5. Such a critical-dimension measurement system is used, for example, in carrying out measurements on a semiconductor wafer.

In the arrangement of FIG. 5, the configuration of the objective lens 2, the laser element 9 and the position sensor 3 correspond to that of FIG. 2 or FIG. 3, and will not be described in more detail. FIG. 5 illustrates the structure of the electron beam column 50, in which the electron beam 1 is generated from an electron gun 51 forming a beam source, and passes via a condenser lens 52 and a scanning means 53 to the objective lens 2, and hence to the wafer 6. Components of FIG. 5 which correspond to those of FIG. 2 are indicated by the same reference numerals.

The arrangement has a control system 54. The electron gun 51 is controlled from a source controller 55, and the beam is condensed by the condenser lens 52 under the control of a condenser controller 56. The output of the position sensor 3 passes to a detector unit 57, and that detector unit 57 controls the objective lens 2 via an objective lens controller 58, and controls the stage 10 via a stage controller 59, to ensure that the electron beam 1 is accurately focussed on the wafer 6 by the objective lens 2 despite changes in height of the wafer 6. Compensation for any such changes in the height of the wafer 6 are achieved by controlling the drive current to the excitation coil 31 of the objective lens 2, or by moving the stage 10 vertically. In addition, in order to observe different parts of the wafer 6, the electron beam 1 is scanned on the wafer 6. For limited scanning ranges, the scanning can be achieved by scanning means 53 under the control of a scanning controller 60. For larger movements, the stage controller 59 causes stage 10, and hence the wafer 6, to move horizontally. The control system 54 is controlled by a control computer 61.

Such an arrangement may also include an optical microscope, as was described with reference to FIG. 3.

The present invention may also be used in an apparatus for electron beam lithography. The structure needed for such electron beam lithography is similar to that shown in FIG. 5, except that a more powerful electron gun 51 must be used, a more complex scanning means 53 is provided, and the control computer 61 has different control programs therein. In particular, in electron beam lithography, the scanning means 53 has both static and magnetic lenses, whereas only magnetic lenses are needed in a critical-dimension measurement system.

Although the embodiments described above are based on an arrangement in which the laser beam 11 passes between the upper and lower poles 28,29 of the objective lens 2, other arrangements are possible within the present invention. This will now be described in more detail with reference to FIGS. 6(a) to 6(e). In FIGS. 6(a) to 6(e) only the electron beam 1, the wafer 6, the laser beam 11, and the upper and lower poles of the objective lens are shown. The other components may be the same as in FIGS. 2 or 3.

FIG. 6 (a) is a schematic view of the known construction shown in FIG. 1. The upper magnetic pole 12 and the lower magnetic pole 13 are above the wafer 6 and a magnetic field is formed between the magnetic poles 12,13. The magnetic field has a lens function for the electron beam 1, and the electron beam 1 is converged on the wafer 6. The laser beam 11 to detect the height passes through the space below the lower pole 13.

FIGS. 6 (b) to 6 (e) are schematic views showing the arrangements within the present invention. FIG. 6 (b) shows the construction of FIG. 2 or FIG. 3, in which the laser beam 11 passes between the upper magnetic pole 28 and the lower magnetic pole 29 so that the lower magnetic pole 29 may be close to the wafer 6.

In the arrangement shown in FIG. 6(c) the lower magnetic pole 61 is positioned below the wafer 6, and the upper magnetic pole 60 has an opening 60A therein through which the laser beam 11 passes to reach the wafer 6. In this arrangement therefore, both the upper and lower magnetic poles 60,61 of the objective lens are on the opposite side of the laser beam 11 from the source of the electron beam 1, i.e. on the side of the laser beam 11 furthest away or facing away from the source of the electron beam 1. On the other hand, they are on opposite sides of the plane of the surface of the wafer 6 on which the electron beam 1 is incident. This is contrasted with the arrangement of FIG. 6(b) in which both the upper and lower magnetic poles 28,29 are above that plane.

Figure 6A:
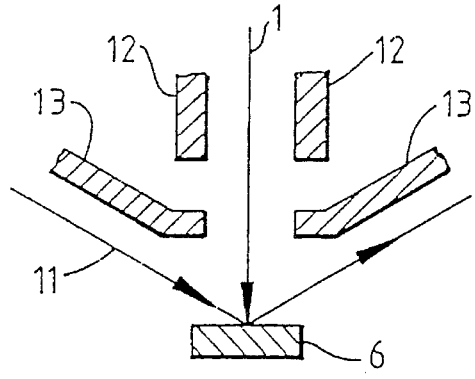
FIG. 6(a) to FIG. 6(e) show alternative arrangements of electron beam, specimen, light beam, and pole pieces of the objective magnetic lens.
Figure 6D:
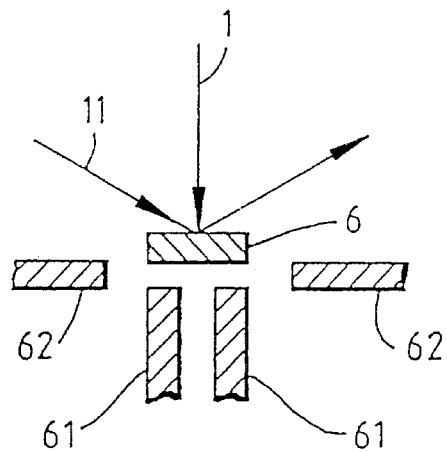
Figure 6B:
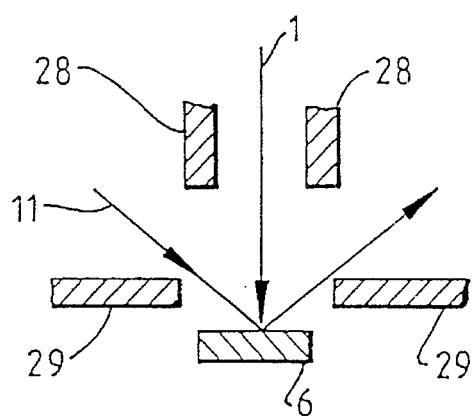
Figure 6E:
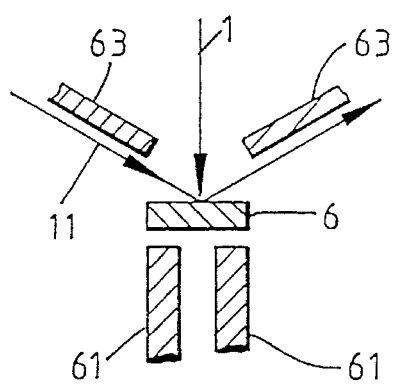
Figure 6C:
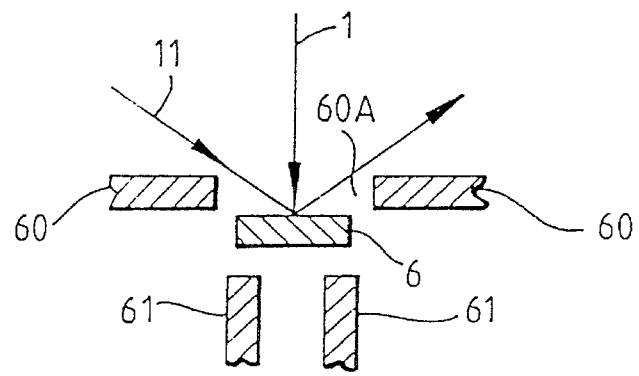

FIG. 6(d) shows a further arrangement, which is similar to that of FIG. 6(c) except that the upper pole 62 is on the same side of that plane as the lower magnetic pole 61. In this arrangement, the magnetic poles 61,62 of the objective lens are wholly clear of the path of the laser beam. Even with such an arrangement, however, a satisfactory field can be achieved between the magnetic poles 61,62 to focus the electron beam 1 on the wafer 6.

FIG. 6(e) shows another arrangement in which the lower pole 61 is on the opposite side of the wafer 6 from the source of the electron beam 1, and in the arrangements of FIG. 6(c) and 6(d), but the laser beam passes between the lower magnetic pole 61 and the upper magnetic pole 63. In this arrangement, the upper magnetic pole 63 is inclined to the axis of the electron beam 1, so that the ends of the upper pole 63 can be as close as possible to the wafer 6, without interfering with the path of the laser beam 11. Thus, the arrangement of FIG. 6(e) is similar to that of FIG. 6(b) in that the laser beam 11 passes between the upper and lower magnetic poles 63,61.

By setting the positional relationship between the light path of the laser beam 11 for measuring the height of the wafer 6 and the magnetic poles of the objective lens as the present invention, a reduction in the thickness of the electron beam, to shorten the focal length of the objective lens can be made compatible with the detection of the height of the specimen, which provides a high performance electron beam apparatus.

In the case of the construction shown in FIG. 6 (b) or FIG. 6 (d), since the dimension of the wafer 6 is not limited by the objective lens, a large sized wafer 6 can be handled. On the other hand, in the case of the construction shown in FIG. 6 (c) or FIG. 6 (e), since an opening is provided at a part of the magnetic path connecting the upper magnetic pole and the lower magnetic pole of the objective lens 2 and through the opening the wafer 6 is inserted and removed, the dimension of the wafer 6 is limited and handling of the specimen 6 becomes complex. However, the electron beam can be made very thin, to shorten the focal length of the objective lens.

In addition to the variations in the arrangement of the upper and lower magnetic poles of the objective lens, as described with reference to FIGS. 6(b) to 6(e), other variations are also possible. For example, it would be possible for the optical microscope 39 in FIG. 3 to be located above the upper magnetic pole 28, so that the viewing path therefrom extended through a window in that upper magnetic pole 28, as well as the window 37 in the lower magnetic pole 29. Moreover, other variations of the electron beam apparatus, relating to the generation and guidance of the electron beam 1 to the objective lens 2 may be used with the present invention, permitting the present invention to be incorporated in many different types of electron beam apparatus. As will be appreciated from the description above, the present invention relates to the arrangement of the poles of the electron lens 2, relative to the wafer 6 and the laser beam 11. Such arrangements are therefore not affected by other variations in the electron beam apparatus. Moreover, although the present invention has been described above for arrangements in which the specimen is a wafer 6 of e.g. semiconductor material, the present invention may also be applied to apparatus for other types of specimens.

What is claimed is:

1. An electron beam apparatus having a mounting stage for supporting a specimen, an electron source for generating an electron beam to be incident on said specimen, an objective magnetic lens for focussing said electron beam on said specimen, a light source for generating a light beam, and a light detector for detecting said light beam, an optical path for said light beam being defined from said light source to said light detector via said specimen; wherein said objective magnetic lens comprises first and second magnetic poles for generating a magnetic field of said objective magnetic lens therebetween, said first and second magnetic poles being respectively arranged on opposite sides of said optical path, said optical path being at least partially delimited between the complete extent of said first and second magnetic poles.

2. An electron beam apparatus according to claim 1, further including an isolation wall having windows therein extending between said first and second pole pieces, and said optical path extends through said windows.

3. An electron beam apparatus according to claim 2, wherein said windows are lenses.

4. An electron beam apparatus according to claim 1, wherein the one of said first and second magnetic poles which is closest to said specimen is a substantially flat plate.

5. An electron beam apparatus according to claim 1, further including an optical microscope for viewing said specimen via a viewing path from said optical microscope to said specimen, and a magnetic path member for connecting said first and second magnetic poles; said viewing path extending through said magnetic path member.

6. An electron beam apparatus according to claim 5, wherein said magnetic path member has a plurality of apertures therein, said plurality of apertures being arranged symmetrically about said electron beam, and said viewing path extends through one of said plurality of apertures.

7. An electron beam apparatus according to claim 1, further including control means for controlling the magnetic field of said objective magnetic lens in response to the detection of said light beam by said light detector.

8. An electron beam apparatus according to claim 1, wherein said mounting stage is moveable, and said electron beam apparatus further includes control means for controlling the movement of said mounting stage in response to the detection of said light beam by said light detector.

9. An electron beam apparatus according to claim 1, wherein one of said first and second magnetic poles includes one aperture through which both said electron beam and said optical path passes.

10. An electron beam apparatus having a mounting stage for supporting a specimen, an electron source for generating an electron beam to be incident on a first side of said specimen, said specimen having a second side opposite said first side, an objective magnetic lens for focussing said electron beam on said specimen, a light source for generating a light beam, and a light detector for detecting said light beam, an optical path for said light beam being defined from said light source to said light detector via said specimen, said optical path having a first side facing toward said electron source and a second side opposite said first side and facing away from said electron source; wherein said objective magnetic lens comprises first and second magnetic poles for generating a magnetic field of said objective magnetic lens therebetween, said first and second magnetic poles being arranged on the second side of said optical path facing away from said electron source, and at least one of said first and second magnetic poles being arranged on said second side of said specimen.

11. An electron beam apparatus according to claim 10, wherein said first and second magnetic poles are arranged on said second side of said specimen.

\* \* \* \* \*

UNITED STATES PATENT AND TRADEMARK OFFICE
CERTIFICATE OF CORRECTION

PATENT NO. : 5,598,002
DATED : Jan. 28, 1997
INVENTOR(S) : TODOKORO, et al

It is certified that error appears in the above-indentified patent and that said Letters Patent is hereby corrected as shown below:

On the title page:

Please correct [21] Appl. No.: to read as follows:

--[21] Appl. No.: 623,664--.

Signed and Sealed this

Sixth Day of May, 1997

*Attest:*

*Attesting Officer*

BRUCE LEHMAN

*Commissioner of Patents and Trademarks*